(12) United States Patent
Seo et al.

(10) Patent No.: US 11,037,884 B2
(45) Date of Patent: Jun. 15, 2021

(54) SEMICONDUCTOR PACKAGE HAVING THROUGH-HOLE INCLUDING SHIELDING WIRING STRUCTURE

(71) Applicant: SAMSUNG ELECTRO-MECHANICS CO., LTD., Suwon-si (KR)

(72) Inventors: Yoon Seok Seo, Suwon-si (KR); Dae Hyun Park, Suwon-si (KR); Sang Jong Lee, Suwon-si (KR); Chul Kyu Kim, Suwon-si (KR); Jae Hyun Lim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 3 days.

(21) Appl. No.: 16/433,439

(22) Filed: Jun. 6, 2019

(65) Prior Publication Data

US 2020/0168558 A1 May 28, 2020

(30) Foreign Application Priority Data

Nov. 27, 2018 (KR) .................. 10-2018-0148326

(51) Int. Cl.
  *H01L 23/552* (2006.01)
  *H01L 23/538* (2006.01)
  *H01L 23/28* (2006.01)

(52) U.S. Cl.
  CPC ........... *H01L 23/552* (2013.01); *H01L 23/28* (2013.01); *H01L 23/5384* (2013.01); *H01L 23/5386* (2013.01)

(58) Field of Classification Search
  CPC ............... H01L 23/552; H01L 23/5384; H01L 23/5386; H01L 23/28
  See application file for complete search history.

(56) References Cited

U.S. PATENT DOCUMENTS

2016/0037640 A1  2/2016 Takai et al.
2016/0338202 A1* 11/2016 Park ................... H01L 24/00
(Continued)

FOREIGN PATENT DOCUMENTS

| KR | 10-2017-0113743 A | 10/2017 |
| KR | 10-2018-0020849 A | 2/2018 |
| WO | 2014/171225 A1 | 10/2014 |

*Primary Examiner* — Matthew E. Gordon
(74) *Attorney, Agent, or Firm* — Morgan, Lewis & Bockius LLP

(57) ABSTRACT

A semiconductor package includes: a frame having a first surface and a second surface opposing each other, and including a through-hole and a wiring structure connected to the first surface and the second surface; a connection structure disposed on the first surface of the frame and including a redistribution layer; a semiconductor chip disposed in the through-hole and including connection pads connected to the redistribution layer; an encapsulant encapsulating the semiconductor chip and covering the second surface of the frame; and a plurality of electrical connection metal members disposed on the second surface of the frame and connected to the wiring structure. The wiring structure includes a shielding wiring structure surrounding the through-hole, and the plurality of electrical connection metal members include a plurality of grounding electrical connection metal members connected to the shielding wiring structure.

17 Claims, 10 Drawing Sheets

(56) References Cited

U.S. PATENT DOCUMENTS

2017/0025361 A1* 1/2017 Lee .................. H01L 24/00
2017/0278830 A1    9/2017 Kim
2018/0053732 A1    2/2018 Baek et al.

* cited by examiner

SEMICONDUCTOR PACKAGE HAVING THROUGH-HOLE INCLUDING SHIELDING WIRING STRUCTURE

CROSS-REFERENCE TO RELATED APPLICATIONS

This application claims the benefit of priority to Korean Patent Application No. 10-2018-0148326 filed on Nov. 27, 2018 in the Korean Intellectual Property Office, the entire disclosure of which is incorporated herein by reference.

TECHNICAL FIELD

The present disclosure relates to a semiconductor package.

BACKGROUND

In recent years, as display modules for mobile devices are increasing in size, there has been increasing demand for the capacity of batteries used in such mobile devices to increase as well. However, as capacity of a battery increases, the surface area occupied by the battery necessarily increases, leading to a size reduction of a printed circuit board (PCB) and consequently, a decreased surface area for mounting components thereon. Therefore, in this context, modularization of components has been gaining increasing interest in the package field.

Meanwhile, one of conventional techniques for mounting a large amount of components may be the chip-on-board (COB) technique. The COB technique involves mounting individual passive components and a semiconductor package on a PCB by using surface mount technology (SMT). However, the COB technique tends to require a relatively large surface area for mounting components in order to maintain a minimum distance among the components, give rise to undesirably high electromagnetic interference (EMI) among the components, and give rise to increased electrical noise due to a large distance between a semiconductor chip and passive components.

SUMMARY

An aspect of the present disclosure is to provide a semiconductor package having a highly reliable EMI shielding structure.

According to an aspect of the present disclosure, a semiconductor package includes: a frame having first and second surfaces opposing each other, a through-hole, and a wiring structure connected to the first and second surfaces; a connection structure disposed on the first surface of the frame and including a redistribution layer; a semiconductor chip disposed in the through-hole and including a connection pad connected to the redistribution layer; an encapsulant encapsulating the semiconductor chip and covering the second surface of the frame; and a plurality of electrical connection metal members disposed on the second surface of the frame and connected to the wiring structure, wherein the wiring structure includes a shielding wiring structure surrounding the through-hole, and the plurality of electrical connection metal members include a plurality of grounding electrical connection metal members connected to the shielding wiring structure.

According to another aspect of the present disclosure, a semiconductor package includes: a frame having first and second surfaces opposing each other, a through-hole, a plurality of insulating layers, and a wiring structure connected to the first surface and the second surface; a connection structure disposed on the first surface of the frame and including a redistribution layer; a semiconductor chip disposed in the through-hole and including a connection pad connected to the redistribution layer; an encapsulant encapsulating the semiconductor chip and covering the second surface of the frame; and a plurality of electrical connection metal members disposed on the second surface of the frame and connected to the wiring structure, wherein the wiring structure includes a plurality of wiring patterns, each disposed on the plurality of insulating layers, and include a plurality of wiring vias, each passing through the plurality of insulating layers to connect the plurality of wiring patterns, wherein the plurality of wiring vias include a plurality of shielding vias arranged so as to surround the through-hole and disposed on the plurality of insulating layers, and the plurality of wiring patterns include a plurality of shielding patterns connecting the plurality of shielding vias in a thickness direction of the semiconductor chip, and wherein the plurality of electrical connection metal members include a plurality of grounding electrical connection metal members connected to the plurality of shielding vias or to the plurality of the shielding patterns.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments of the present disclosure will be described with reference to the accompanying drawings. In the accompanying drawings, shapes, sizes, and the like, of components may be exaggerated or simplified for clarity.

Electronic Device

Figure 1:
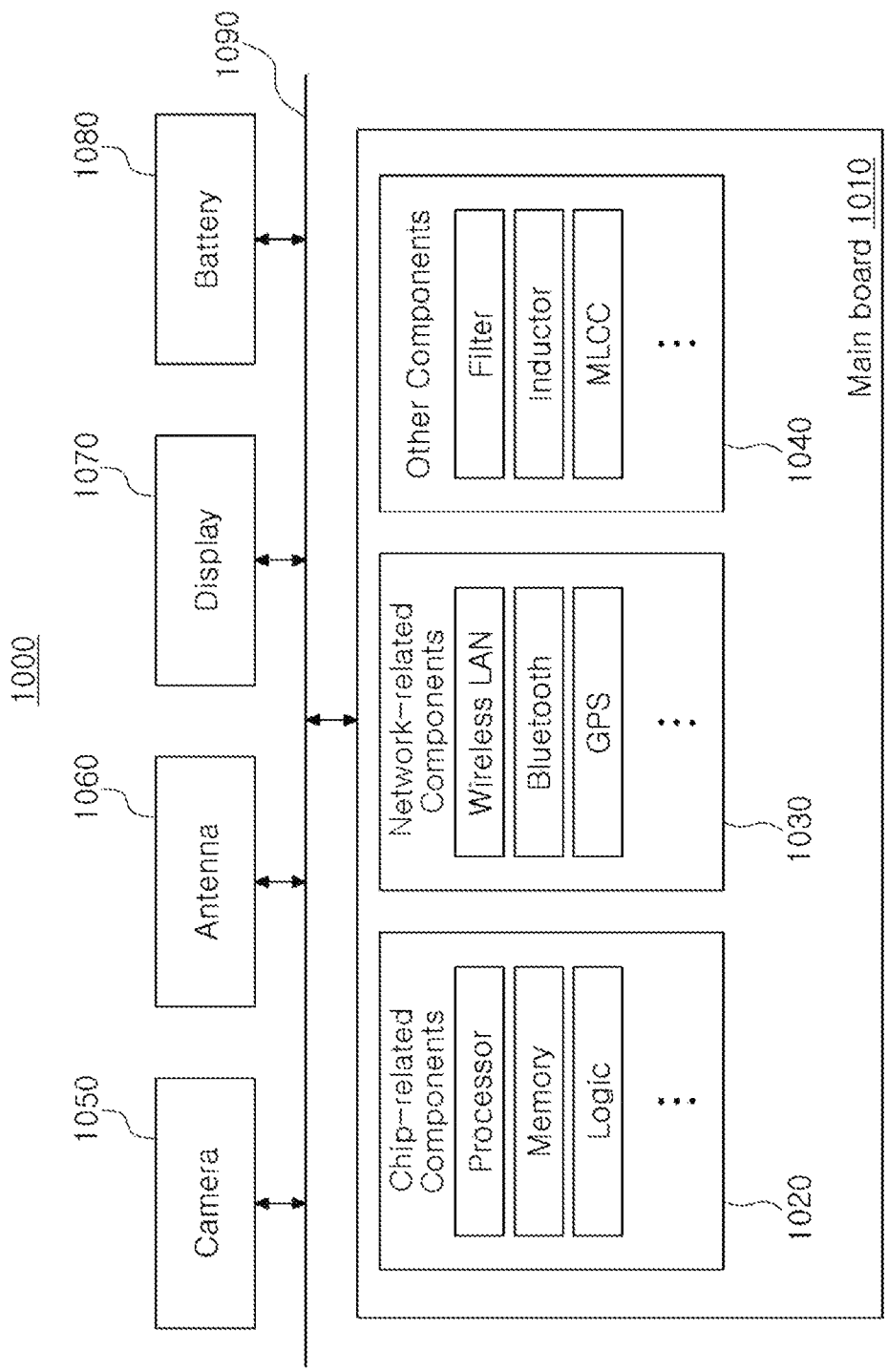
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
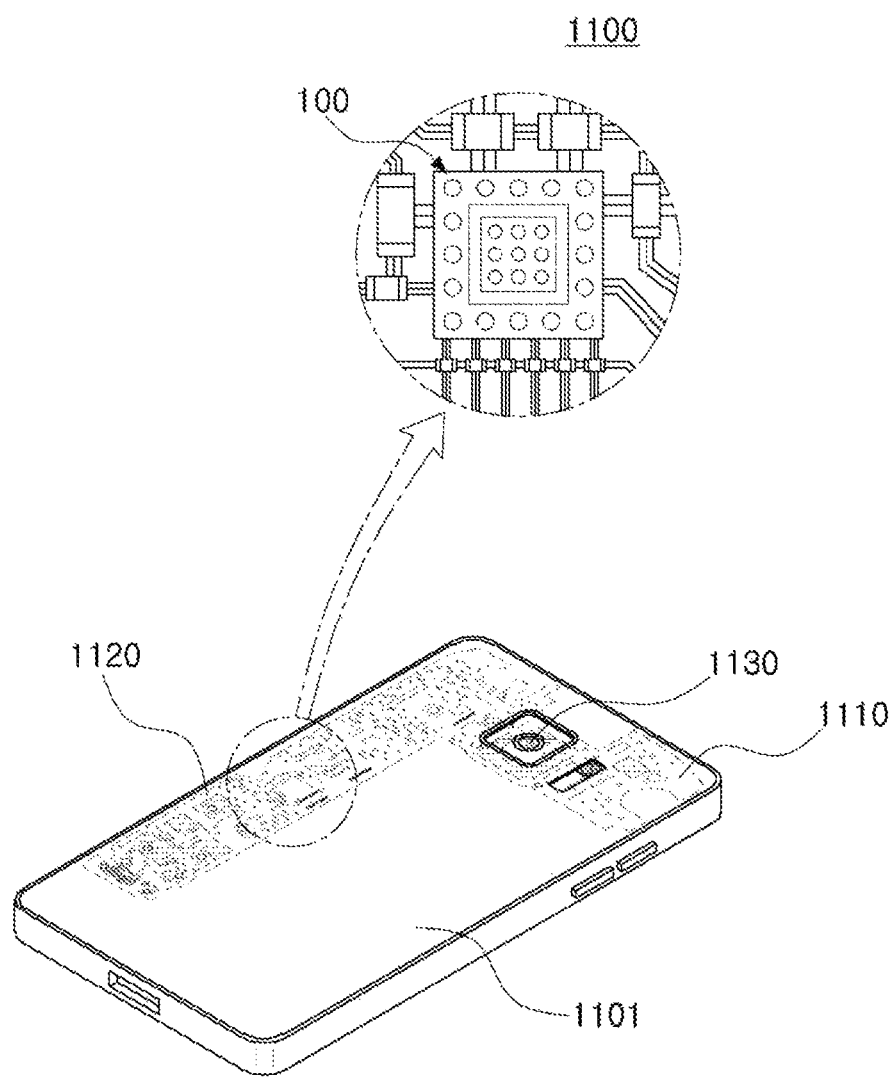
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
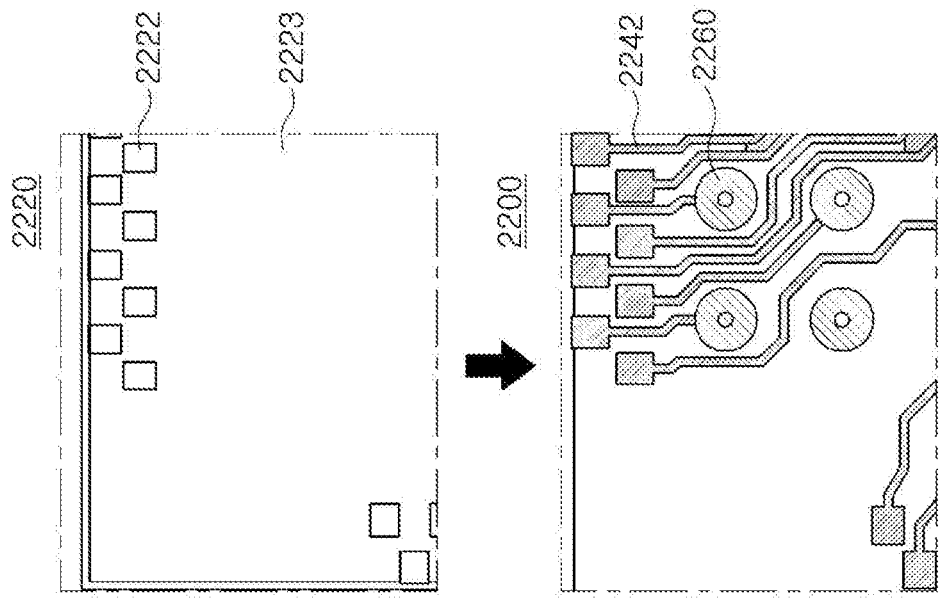
FIGS. 3A and 3B are schematic cross-sectional views illustrating a fan-in semiconductor package before and after being packaged.
Figure 3A:
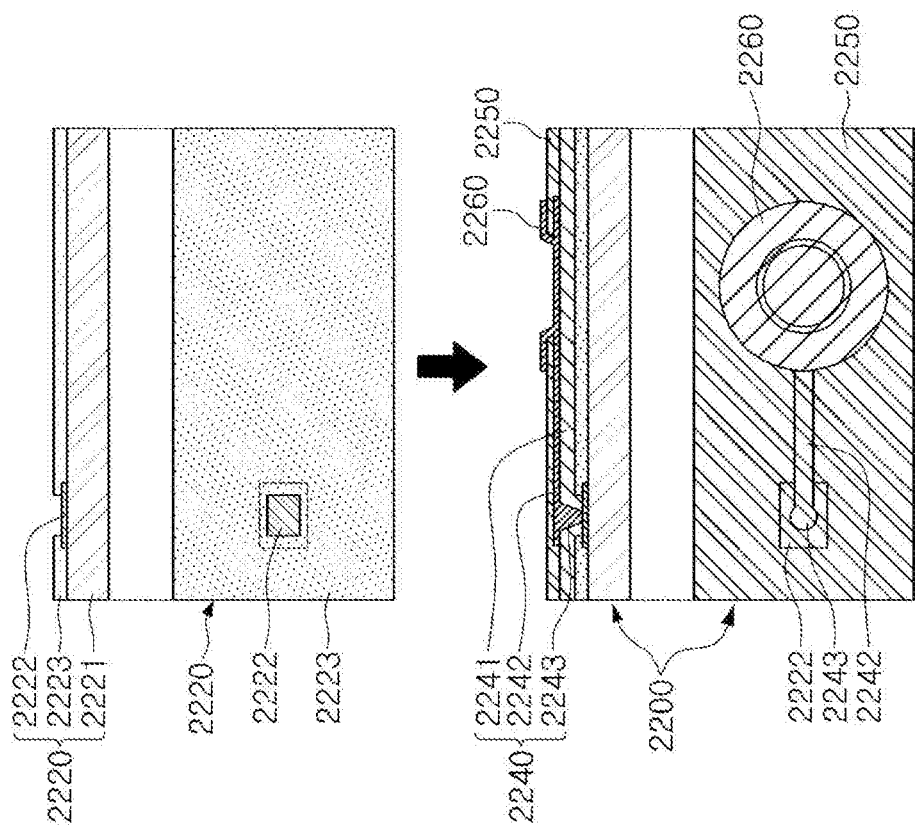
Figure 4:
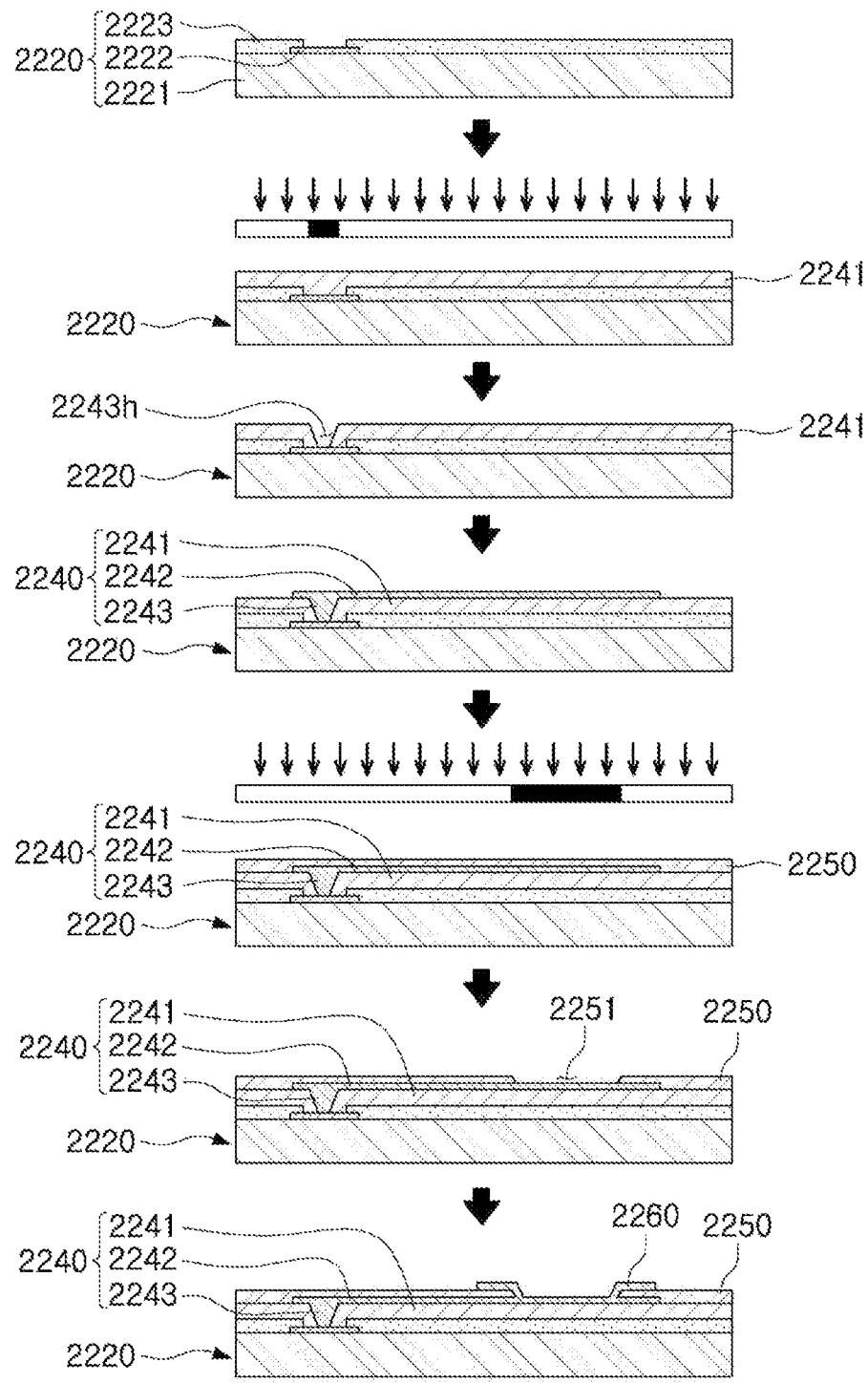
FIG. 4 shows a series of schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
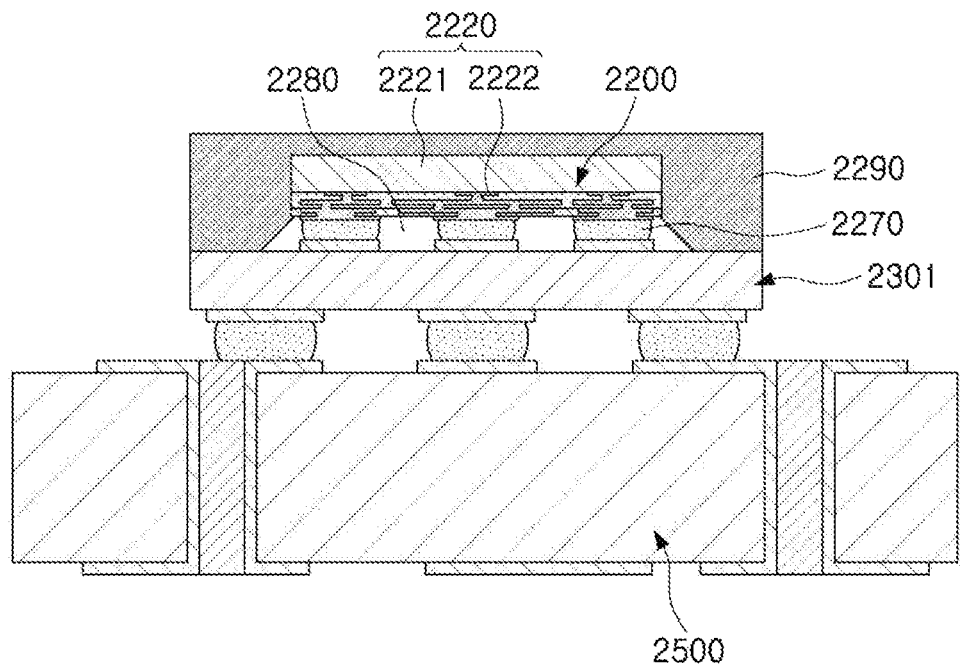
FIG. 5 is a schematic cross-sectional view illustrating a fan-in semiconductor package mounted on an interposer substrate that is ultimately mounted on a main board of an electronic device.
Figure 6:
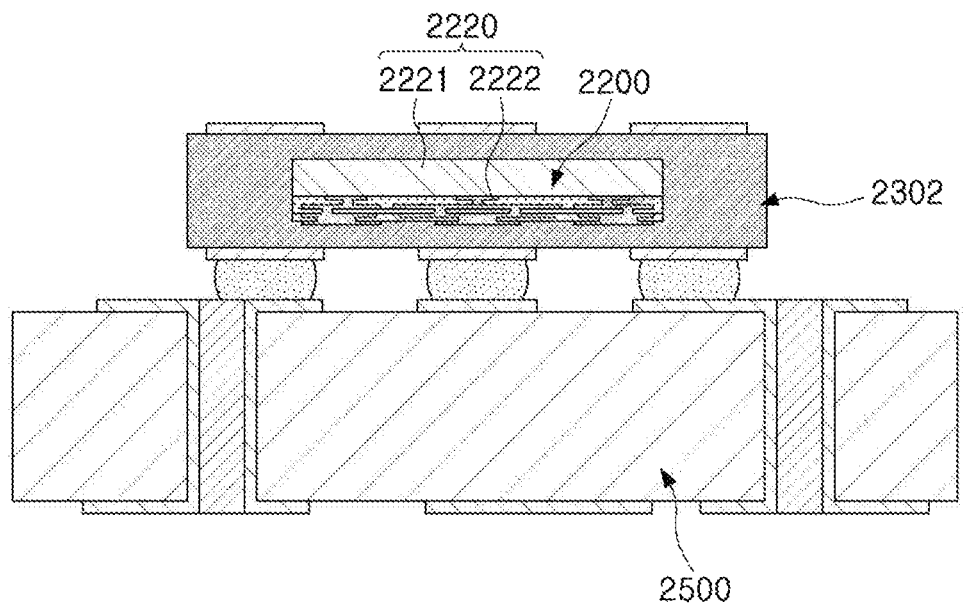
FIG. 6 is a schematic cross-sectional view illustrating a fan-in semiconductor package embedded in an interposer substrate that is ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-out Semiconductor Package

Figure 7:
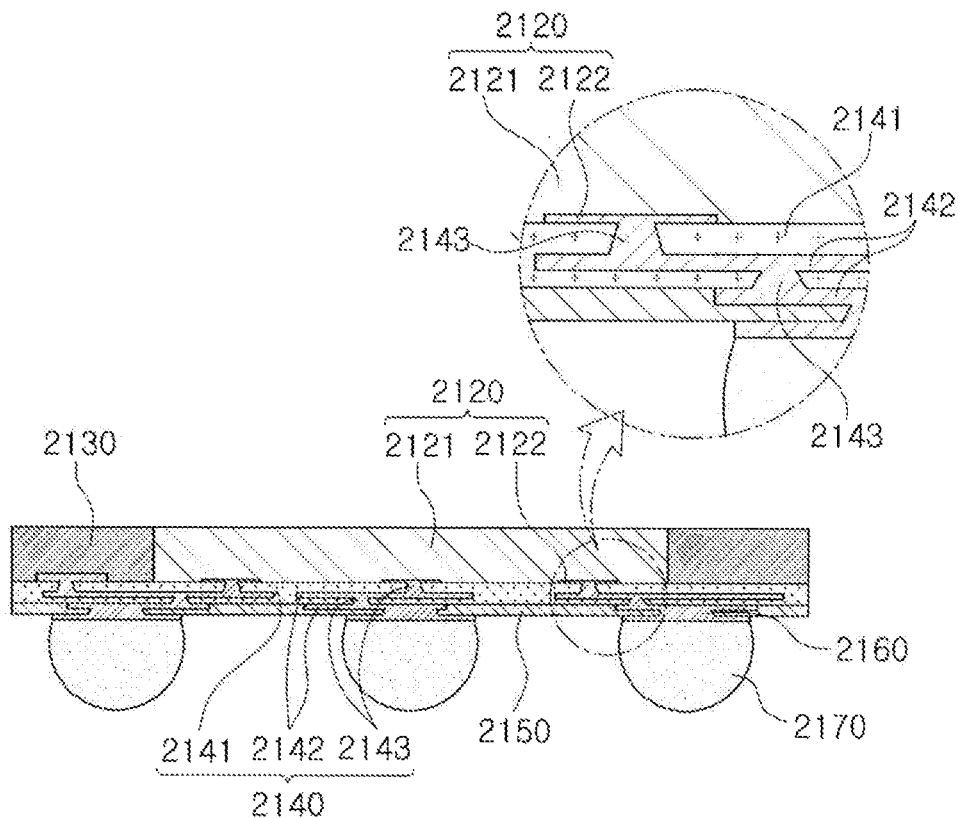
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
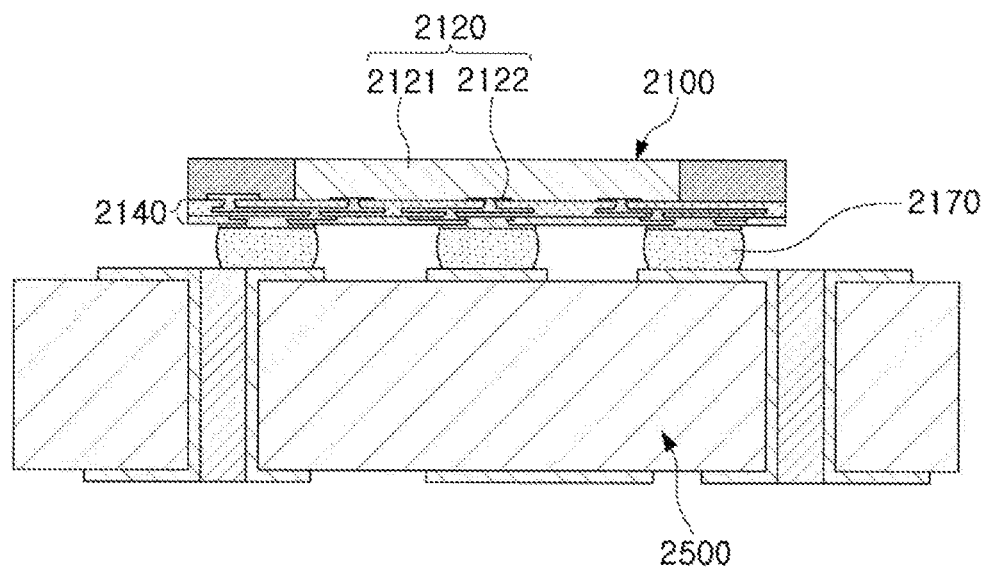
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB) and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
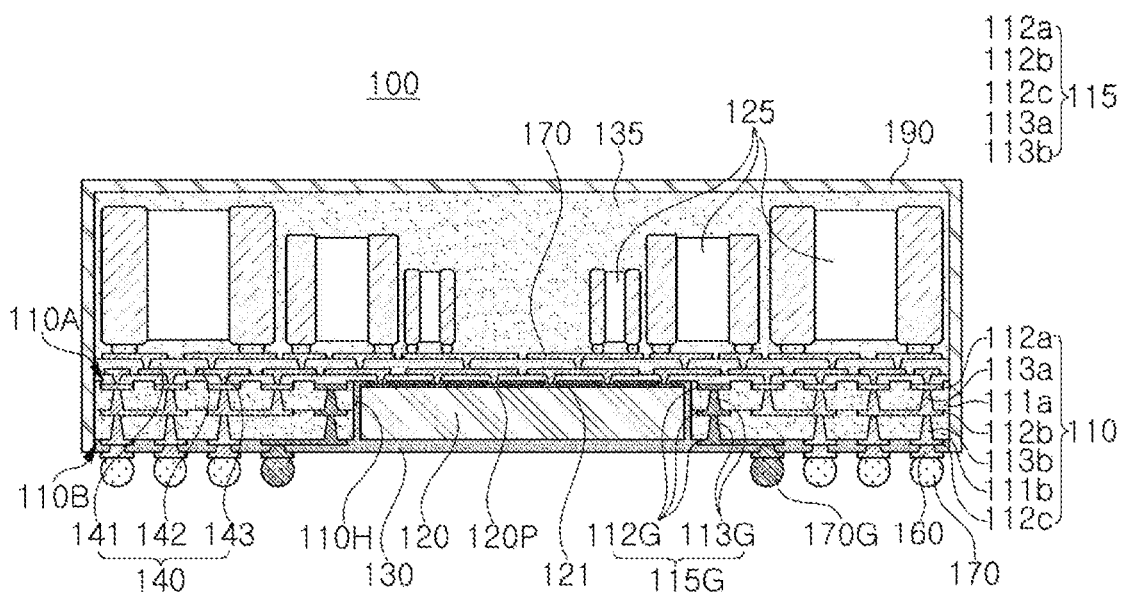
FIG. 9 is a schematic cross-sectional view of a semiconductor package according to an exemplary embodiment of the present disclosure.
Figure 10:
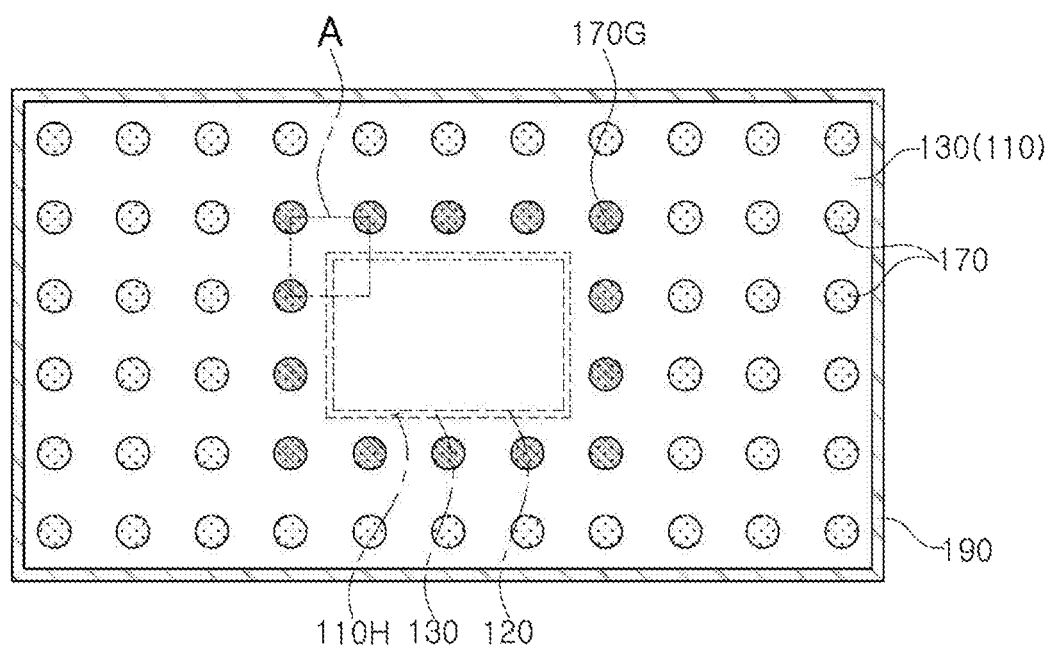
FIG. 10 is a bottom view of a mounting surface of the semiconductor package of FIG. 9.

FIG. 9 is a schematic cross-sectional view of a semiconductor package according to an exemplary embodiment, and FIG. 10 is a bottom view illustrating a component mounting surface of the semiconductor package of FIG. 9.

Referring to FIG. 9, a semiconductor package 100 according to the present exemplary embodiment includes: a frame 110 having a first surface 110A and a second surface 110B opposing each other and including a through-hole 110H; a connection structure 140 disposed on the first surface 110A of the frame 110 and including a redistribution layer 142; a semiconductor chip 120 disposed in the through-hole 110H and including connection pads 120P connected to the redistribution layer 142; and a first encapsulant 130 encapsulating the semiconductor chip 120 and covering the second surface 110B of the frame 110.

The frame 110 includes a wiring structure 115 connected to the first surface 110A and the second surface 110B, and the semiconductor package 110 may include a plurality of electrical connection metal members 170 disposed on the second surface 110B of the frame 110. The plurality of electrical connection metal members 170 may be connected to the wiring structure 115 (a third wiring pattern 112c in particular). In the present exemplary embodiment, an under-bump metal (UBM) layer 160 may be additionally disposed between each of the electrical connection metal members 170 and the wiring structure 115.

The wiring structure 115 may include a shielding wiring structure 115G disposed to surround the through-hole 110H. The shielding wiring structure 115G may be arranged to substantially surround the semiconductor chip 120 to block emission of electromagnetic waves. Also, the plurality of electrical connection metal members 170 may include a plurality of grounding electrical connection metal members 170G connected to the shielding wiring structure 115G.

Since in the package structure according to the present exemplary embodiment, the semiconductor chip 120 is disposed in proximity to a mounting surface of the semiconductor package 100, electromagnetic waves can be easily emitted from the semiconductor chip 120 through a path formed by virtue of space under the mounting surface; however, as illustrated in FIG. 10, the shielding wiring structure 115G can be arranged together with the plurality of grounding electrical connection metal members 170G connected thereto, so as to surround the through-hole 110H, thereby effectively blocking electromagnetic interference (EMI) from the mounting surface.

The frame 110 may include an insulating member in which a plurality of insulating layers 111a and 111b are stacked one on top of the other. The wiring structure 115 may include a plurality of wiring patterns 112a, 112b, and 112c formed on the plurality of insulating layers 111a and 111b, and a plurality of wiring vias 113a and 113b passing through the plurality of insulating layers 111a and 111b to connect the plurality of wiring patterns 112a, 112b, and 112c to each other.

More specifically, in the present exemplary embodiment, as illustrated FIG. 9, the plurality of insulating layers include the first and second insulating layers 111a and 111b providing the first and second surfaces 110A and 110B, respectively. The plurality of wiring patterns may include: a first wiring pattern 112a buried in the first insulating layer 111a and disposed contiguous with the connection structure 140; a second wiring pattern 112b disposed on the other surface of the first insulating layer 111a opposing one surface of the first insulating layer 111a in which the first wiring pattern 112a is buried; and a third wiring pattern 113 disposed on the other surface of the second insulating layer 111b opposing one surface of the second insulating layer 111b on which the second wiring pattern 112b is disposed. Also, the plurality of wiring vias may include a first wiring via 113a passing through the first insulating layer 111a to connect the first and second wiring patterns 112a and 112b to each other, and a second wiring via 113b passing through the second insulating layer 111b to connect the second and third wiring patterns 112b and 112c to each other.

In the present exemplary embodiment, the first wiring pattern 112a may be recessed within the first insulating layer 111a. As illustrated in the present exemplary embodiment, when the first wiring pattern 112a is recessed within the first insulating layer 111a, a lower surface of the first insulating layer 111a and a lower surface of the first wiring pattern 112a may have a step formed therebetween, and in this case, such a step can serve to prevent the material of the first encapsulant 130 from bleeding out to contaminate the first wiring pattern 112a.

In the present exemplary embodiment, the shielding wiring structure 115G may include a plurality of shielding vias 113G arranged so as to surround the through-hole 110H, and may include a plurality of shielding patterns 112G connecting the plurality of shielding vias 113G to each other in a thickness direction of the semiconductor chip 120.

The plurality of shielding vias 113G are a portion of the first and second wiring vias 113a and 113b, the portion surrounding the through-hole 110H, and may be formed together with the first and second wiring vias 113a and 113b on a same level. Likewise, the plurality of shielding patterns 112G are a portion of the first to third wiring patterns 112a, 112b, and 112c, the portion disposed around the through-hole 110H, and may be formed together with the first to third wiring patterns 112a, 112b, and 112c on a same level.

As illustrated in FIG. 9, the plurality of shielding vias 113G formed on each of the first and second insulating layers 111a and 111b may be stacked on each other with the shielding patterns 112G interposed therebetween. The plurality of shielding vias 113G employed in the present exemplary embodiment may be arranged so such that adjacent shielding vias disposed on different levels in a thickness direction overlap each other in a plan view of the semiconductor package 100. For example, the shielding vias 113G disposed on the first and second insulating layers 111a and 111b may be arranged to overlap each other in the plan view.

Figure 11:
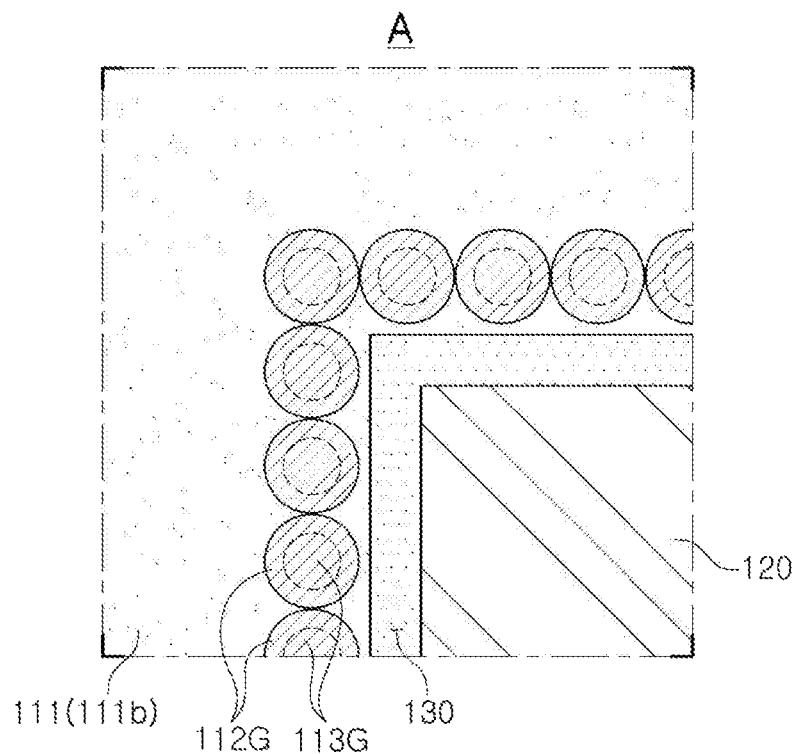
FIG. 11 is a plan view illustrating an arrangement of shielding vias in region "A" of the semiconductor package of FIG. 10.

FIG. 11 illustrates an arrangement of a plurality of shielding vias 113G on a same level. The region illustrated in FIG. 11 corresponds to region "A" of the semiconductor package of FIG. 10 and represents an arrangement of the shielding vias 113G on a level that corresponds to the second insulating layer 111b. As illustrated in FIG. 11, the shielding vias 113G employed in the present exemplary embodiment may be arranged to be in close proximity with other shielding vias adjacent thereto. The shielding vias 113G, since they are not used as a signal line but as EMI shielding means for the semiconductor chip 120, may be arranged so densely as to be practically contiguous with each other for the purpose of improving EMI shielding performance. However, an arrangement of the shielding vias 113G is not limited thereto and alternatively, the shielding vias 113G may be evenly spaced part from each other in another exemplary embodiment.

Figure 12:
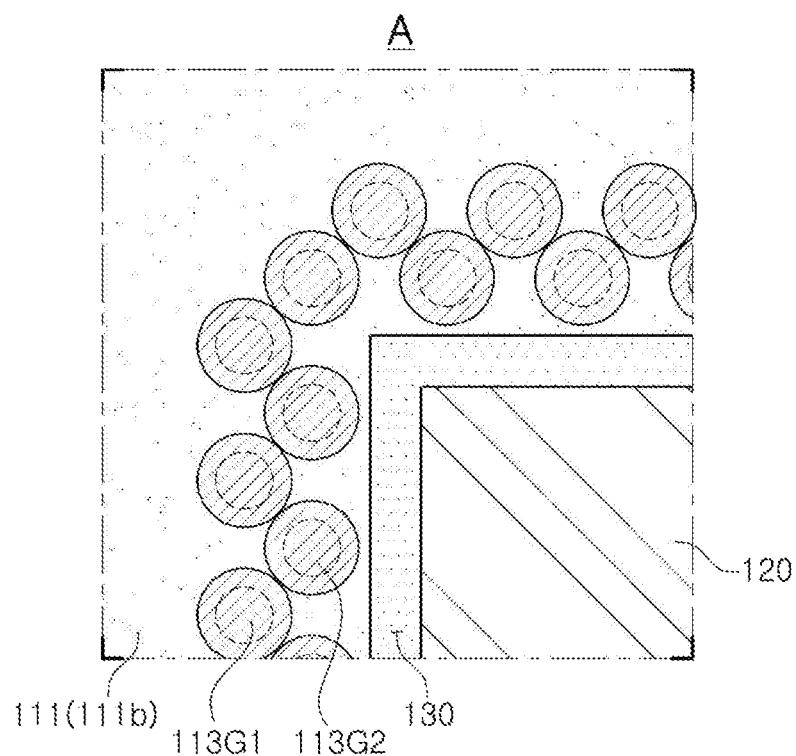
FIG. 12 is a plan view illustrating an arrangement of shielding vias of a semiconductor package according to another exemplary embodiment.

Alternatively, as illustrated in FIG. 12, a plurality of shielding vias 113G1 and 113G2 may be arranged in two or more rows to surround a through-hole 110H in consideration of EMI shielding performance. FIG. 12 is a region corresponding to FIG. 11 and illustrates another exemplary arrangement of shielding vias on a level corresponding to the second insulating layer 111b. The shielding vias 113G1 and 113G2 in first and second rows may be more densely arranged in a zig-zag manner in a plan view of the semiconductor package 100, as compared to a single line arrangement of the shielding vias 113G in FIG. 11. A plurality of shielding vias may be arranged in various forms, surrounding the through-hole.

The semiconductor package 100 according to the present exemplary embodiment is disposed on the connection structure 140 and may further include a plurality of passive components 125 connected to the redistribution layer 142.

Likewise, a semiconductor chip 120 and a plurality of passive components 125 may be disposed on a lower surface and an upper surface of a connection structure 140, respectively, and may be each electrically connected to a redistribution layer 142. The connection structure 140 may include the semiconductor chip 120, a plurality of insulating layers 141 disposed on a first surface of the frame 110, and the redistribution layer 142 and a via 143 disposed on the plurality of insulating layers 141. The redistribution layer 142 employed in the present exemplary embodiment is illustrated as being two levels of redistribution layers; however, in some other exemplary embodiments, the redistribution layer 142 may include a single level of a redistribution layer, or three or more levels of redistribution layers. The plurality of passive components 125 are illustrated as being mounted on the connection structure 140 by surface mount technology (SMT), for example, but are not limited thereto.

As described above, a conventional package horizontally arranges electronic components, such as semiconductor chips and passive components; however, such horizontal arrangement necessitates an installation space for each component, causing the size of the package, particularly the surface area thereof on a plane, to increase. Furthermore, if the passive components are encapsulated together with the semiconductor chip 120 by a first encapsulant 130, it would be difficult to replace the passive components when debugging, rendering characteristics tuning difficult.

Meanwhile, the semiconductor package 100 according to the present exemplary embodiment can distribute a plurality of electronic components onto upper and lower surfaces of the connection structure 140. More specifically, the passive components 125 may be mounted on the upper surface of the connection structure 140 opposing the lower surface of the connection structure 140 to which the semiconductor chip 120 is connected, and at least a portion of the passive components 125 can be disposed to overlap the semiconductor chip 120 in a plan view of the semiconductor package 100, thereby reducing the size of the semiconductor package 100. The passive components 125 may have different thicknesses from each other. Accordingly, the semiconductor package 100 can advantageously enable, first, sealing the semiconductor chip 120 with the first encapsulant 130, thereafter mounting the passive components 125, and performing a test on or debugging of the passive components 125.

The semiconductor package 100 according to the present exemplary embodiment may further include a second encapsulant 135 encapsulating a plurality of passive components 125 and a metal layer 190 covering an upper surface and a side surface of the second encapsulant 135. The metal layer 190 covers the upper surface and the side surface of the second encapsulant 135 and extends onto the connection structure 140 and a side surface of a frame 110. The metal layer 190 may be connected to a redistribution layer 142 in regions not illustrated in the drawings, thereby receiving ground signals from the connection structure 140, but is not limited thereto. The EMI shielding function of the semiconductor package 100 may be improved by virtue of the metal layer 190. The metal layer 190 contains a metal material, and examples of the metal material include copper (Cu), aluminum (Al), silver (Ag), tin (Sn), gold (Au), nickel (Ni), lead (Pb), titanium (Ti), and an alloy thereof.

Hereinbelow, components included in a semiconductor package 100A according to the present exemplary embodiment will be described in greater detail.

A frame 110 may serve to further improve rigidity of a semiconductor package 100 depending on the type of material constituting insulating layers 111a and 111b, and may serve to ensure a uniform thickness of the first encapsulant 130. The frame 110 may include a cavity 110H passing through the insulating layers 111a and 111b. The cavity 110H has the semiconductor chip 120 disposed therein, and in some exemplary embodiments of the present disclosure, may further have a passive component disposed therein. A wall surface of the cavity 110H may have a shape surrounding the semiconductor chip 120 but is not limited thereto.

Figure 15:
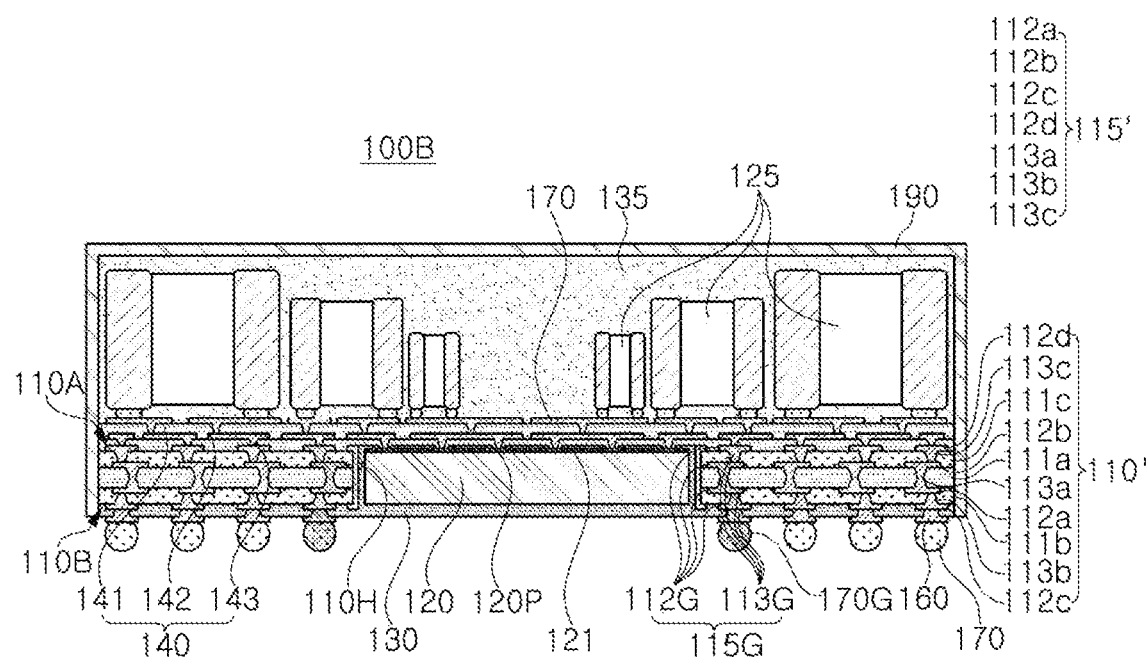

The wiring structure 115 of the frame 110 used in the present exemplary embodiment is illustrated as including three levels of wiring patterns 112a, 112b, and 112c, and wiring vias 113a and 113b connecting the wiring patterns 112a, 112b, and 112c, but may be embodied in a different number of levels or/and in various other structures (see FIG. 15).

The material of the insulating layers 111a and 111b is not limited to the aforementioned materials. For example, the insulating layers 111a and 111b may be formed using an insulating material, and examples of the insulating material include thermosetting resin such as epoxy resin, thermoplastic resin such as polyimide, or resin in which the thermosetting resin or the thermoplastic resin is mixed with inorganic filler, such as ABF and the like. Alternatively, materials in which one of the aforementioned resins is impregnated with inorganic filler in core material such as glass fiber, glass cloth, and glass fabric, such as prepreg, may be used. In some exemplary embodiments of the present disclosure, a photo-imageable dielectric (PID) resin may be used as well.

As described above, the wiring structure 115, which includes the first to third wiring patterns 112a, 112b, and 112c, and the first and second wiring vias 113a and 113b, may provide a vertical connection path of the semiconductor package 100, and may serve to redistribute the connection pads 120P of the semiconductor chip 120. The first to third wiring patterns 112a, 112b, and 112c may be formed using a conductive material such as copper (Cu), aluminum (Al), silver (Ag), tin (Sn), gold (Au), nickel (Ni), lead (Pb), and titanium (Ti), or an alloy thereof. The first to third wiring patterns 112a, 112b, and 112c may serve various functions according to a design specification of a corresponding layer. For example, the first to third wiring patterns 112a, 112b, and 112c may include GND patterns, PWR patterns, S patterns, or the like. More specifically, the S pattern includes various signals except for the GND patterns, the PWR patterns, and the S patterns, such as data signals. Also, the first to third wiring patterns 112a, 112b, and 112c include via pads, wire pads, and pads for electrical connection metals. Each of the first to third wiring patterns 112a, 112b, and 112c may be formed using a plating process known in the art and may include a seed layer and a conductive layer. Each of the first to third wiring patterns 112a, 112b, and 112c may have a thickness greater than a thickness of the redistribution layer 142.

The first and second wiring vias 113a and 113b electrically connect the wiring patterns 112a, 112b, and 112c formed on different layers to each other, thus forming an electrical path within the frame 110. The first and second wiring vias 113a and 113b may be formed using a conductive material such as copper (Cu), aluminum (Al), silver (Ag), tin (Sn), gold (Au), nickel (Ni), lead (Pb), and titanium (Ti), or an alloy thereof. The first and second wiring vias 113a and 113b may be each a filled-type via filled with conductive material or a conformal-type via in which conductive material is formed along a wall of the via. Also, each of the first and second wiring vias 113a and 113b may have a tapered shape. The first and second wiring vias 113a and 113b may be formed by a plating process and include a seed layer and a conductive layer.

When forming a hole for the first wiring via 113a, a portion of the first wiring pattern 112a may serve as a stopper. Accordingly, it may be advantageous in terms of processing if the first wiring via 113a has a tapered shape of which a width of the upper end is greater than that of the lower end. In this case, the first wiring via 113a may be integrated with the second wiring pattern 112b. Also, when forming a hole for the second wiring via 113b, a portion of the second wiring via 113b may serve as a stopper. Accordingly, it may be advantageous in terms of processing if the second wiring via 113b also has a tapered shape of which a width of the upper end is greater than a width of the lower end in a similar manner described for the first wiring via 113a. In this case, the second wiring via 113b may be integrated with the third wiring pattern 112c. Also, although not illustrated in the drawings, in some exemplary embodiments of the present disclosure, a metal layer (not illustrated) may be disposed on a wall surface of the cavity 110H of the frame 110 for the purpose of shielding electromagnetic waves or dissipating heat, and the metal layer may surround the semiconductor chip 120.

The semiconductor chip 120 may be an integrated circuit (IC) in which more than several hundreds to several millions of components are integrated in a single chip. For example, the IC may be a processor chip such as a central processor (for example, CPU), a graphic processor (for example, GPU), a field-programmable gate array (FPGA), a digital signal processor, an encryption processor, a microprocessor, a microcontroller, and the like. More specifically, the semiconductor chip 120 may be an application processor (AP) but is not limited thereto. The semiconductor chip 120 may be a memory chip such as a volatile memory (for example, DRAM), a non-volatile memory (for example, ROM), a flash memory, and the like; a logic chip such as an analog-digital converter, an application-specific IC (ASIC), and the like; or a chip of other types, such as a power management IC (PMIC), or a combination thereof may be used for the semiconductor chip 120.

The semiconductor chip 120 may be an integrated circuit in a bare state without bumps or wiring layers formed therein. However, the semiconductor chip 120 is not limited thereto, and may be a packaged-type integrated circuit as needed. The integrated circuit may be formed based on an active wafer. In this case, the base material forming a body portion 121 of the semiconductor chip 120 may include silicon (Si), germanium (Ge), gallium arsenic (GaAs), or the like. The body portion may have various circuits formed therein. The connection pads 120P are provided for the purpose of electrically connecting the semiconductor chip 120 to other components and may be formed of a conductive material such as aluminum (Al) and the like, but is not limited thereto. There may be a passivation layer 121 exposing the connection pads 120P on the body portion, and the passivation layer 121 may be an oxide layer or a nitride layer, or may be a double layer including both an oxide layer and a nitride layer. Additional insulating layers (not illustrated) may be further disposed on other suitable areas. Meanwhile, a surface of the semiconductor chip 120 on which the connection pads 120P are disposed becomes an active surface, and the other surface of the semiconductor chip 120 becomes an inactive surface. In a case in which the passivation layer 121 is formed on the active surface of the semiconductor chip 120, The first encapsulant 130 encapsulates the frame 110 and the semiconductor 120 and at least partially fills the cavity 110H. The first encapsulant 130 is formed of an insulating material, and the insulating material may be a material containing inorganic filler and insulating resin, for example, thermosetting resin such as epoxy resin, thermoplastic resin such as polyimide, or resin in which the thermosetting resin or the thermoplastic resin is mixed with a stiffening agent such as inorganic filler. Examples of such material include ABF, FR-4, BT, resin, and the like. Also, a molding material such as EMC, or a photosensitive material such as a photo-imageable encapsulant (PIE), may be used. In some exemplary embodiments of the present disclosure, the first encapsulant 130 may be formed using a material in which an insulating resin, such as thermosetting resin or thermoplastic resin, is impregnated in an inorganic filler and/or a core material such as glass fiber, glass cloth, and glass fabric.

The connection structure 140 may be configured to redistribute the connection pads 120P of the semiconductor chip 120. Through the connection structure 140, the connection pads 120P of several tens to several hundreds of semiconductor chips 120 having various functions can be redistributed, and through electrical connection metal members 170, can be physically and/or electrically connected to an external component metal members based on functions thereof. Although the connection structure 140 is illustrated as including two insulating layers 141, two redistribution layers 142, and two redistribution vias 143, the connection structure 140 may include a single layer or a greater number of layers than those illustrated in the drawings.

The insulating layer 141 may be formed using an insulating material, such as a PID material. Since fine pitches can be incorporated through photo vias in this case, the connection pads 120P of several tens to several hundreds of semiconductor chips 120 can be redistributed extremely effectively.

The redistribution layer 142 may redistribute the connection pads 120P of the semiconductor chip 120 to electrically connect the connection pads 120P to the electrical connection metal members 170. The redistribution layer 142 may be formed using a conductive material such as copper (Cu), aluminum (Al), silver (Ag), tin (Sn), gold (Au), nickel (Ni), lead (Pb), titanium (Ti), or an alloy thereof. The redistribution layer 142 may serve various functions according to a design specification. For example, the first redistribution layer 142 may include GND patterns, PWR patterns, S patterns, or the like. In particular, the S patterns include various signals except for the GND patterns, the PWR patterns, and the like, such as data signals. Also, the first redistribution layer 142 may include via pads, pads for electrical connection metal, and the like.

The redistribution via 143 may electrically connect redistribution layers 142 formed on different layers to each other and may be used to provide for electrical connections between the connection pads 120P of the semiconductor chip 120 and the redistribution layers 142. The redistribution via 143, when the semiconductor chip 120 is a bare die, may be in physical contact with the connection pad 120P. The redistribution via 143 may be formed of a conductive material such as copper (Cu), aluminum (Al), silver (Ag), tin (Sn), gold (Au), nickel (Ni), lead (Pb), titanium (Ti), or an alloy thereof. Also, the redistribution via 143 may be a via completely filled with a conductive material, or a via formed of a conductive material formed along a wall of the via. Also, the redistribution via 143 may have a tapered shape.

Additionally, a passivation layer (not illustrated) may be disposed on the first encapsulant 130 as a layer for protecting a semiconductor package from external physical and chemical damage and the like. The passivation layer may include insulating resin and inorganic filler while not including glass fiber. The passivation layer may be formed using ABF, but is not limited thereto. Alternatively, the passivation layer may be formed using PID.

The UBM layer 160 may be used to improve connection reliability of the electrical connection metal members 170. More specifically, the UBM layer 160 may improve board level reliability of the semiconductor package 100 of the present exemplary embodiment. The UBM layer 160 may be provided in an amount of several tens to several hundreds of thousands. Each UBM layer 160 may be connected to the wiring structure 115. The UBM layer 160 may be formed using metal by a metallization method known in the art, but is not limited thereto.

The electrical connection metal members 170 are a configuration provided for physically and/or electrically connecting the semiconductor package 100 to an external component. For example, the semiconductor package 100 may be mounted on a mainboard of an electronic device through the electrical connection metal members 170. The electrical connection metal members 170 may be formed of a low melting-point metal, such as tin (Sn) or an alloy containing tin (Sn). More specifically, the electrical connection metal members 170 may be formed of solders and the like, but there are mere examples, and the electrical connection metal members 170 are not limited to any particular material. Each of the electrical connection metal members 170 may be a land, a ball, a pin, or the like. The electrical connection metal members 170 may be formed in multiple layers or a single layer. When formed in multiple layers, the electrical connection metal members 170 may include, for example, tin-silver solders or copper, but are not limited thereto. The number, interval, and arrangement of the electrical connection metal members 170 are not particularly limited, but may be variously modified depending on a design specification by a person skilled in the art. For example, the number of electrical connection metal members 170 may range from several tens to several thousands depending on the number of connection pads 120P, and may be more or less than the above range.

At least one of the electrical connection metal members 170 is disposed in a fan-out region. The fan-out region refers to a region not overlapping the region on which the semiconductor chip 120 is disposed. The fan-out package has superior reliability than the fan-in package, can implement a large amount of I/O terminals, and can facilitate implementation of 3D interconnection. Also, the fan-out package can be more thinly fabricated than a BGA package, an LGA package, and the like, and can have a more competitive price.

Figure 13:
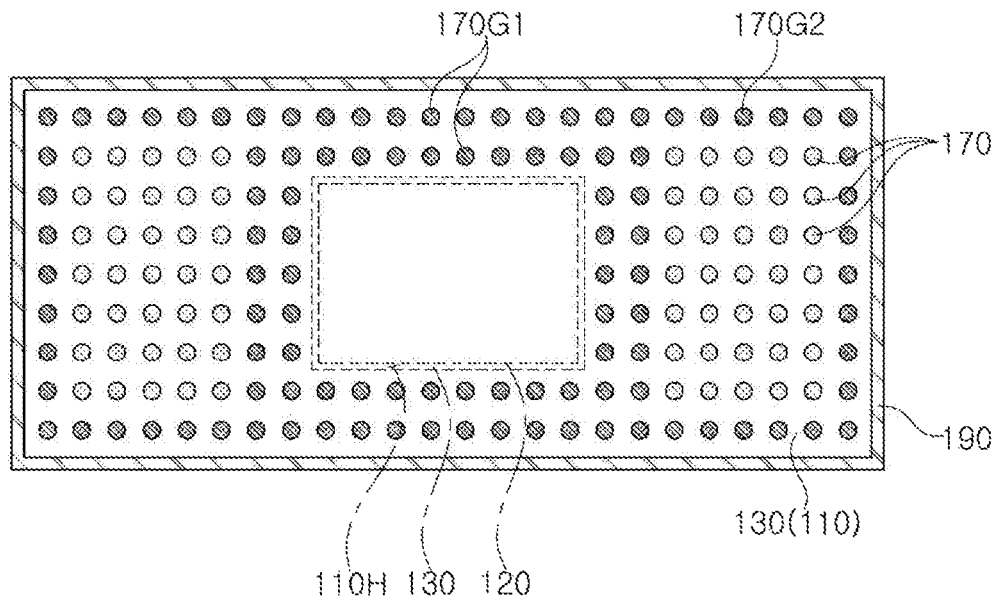
FIG. 13 is a bottom view illustrating a mounting surface of a semiconductor package according to another exemplary embodiment of the present disclosure.

FIG. 13 is a bottom view illustrating a mounting surface of a semiconductor package according to another exemplary embodiment.

Referring to FIG. 13, a plurality of electrical connection metal members 170 are arranged on a mounting surface of the semiconductor package. The electrical connection metal members 170 are illustrated as being arranged in a 9×24 matrix in FIG. 13, but an arrangement of the electrical connection metal members 170 is not limited thereto.

The electrical connection metal members 170 employed in the present exemplary embodiment include first grounding electrical connection metal members 170G1 surrounding a through-hole 110H. The first grounding electrical connection metal members 170G1 are arranged in two rows, thereby further improving EMI shielding effects. However, the first grounding electrical connection metal members 170G1 are not limited thereto and may be arranged in three or more rows in other exemplary embodiments.

The plurality of electrical connection metal members 170 include second grounding electrical connection metal members 170G2 disposed adjacent to corners of a second surface of the frame 110. The second grounding electrical connection metal members 170G2 may be arranged on contours of the semiconductor package 110, more specifically, an outer edge of the mounting surface of the semiconductor package 110. Also, metal layers 190 illustrated in FIG. 9 may be connected to the second grounding electrical connection metal members 170G2 through a redistribution layer 142 and/or a ground pattern of a wiring structure 115.

Figure 14:
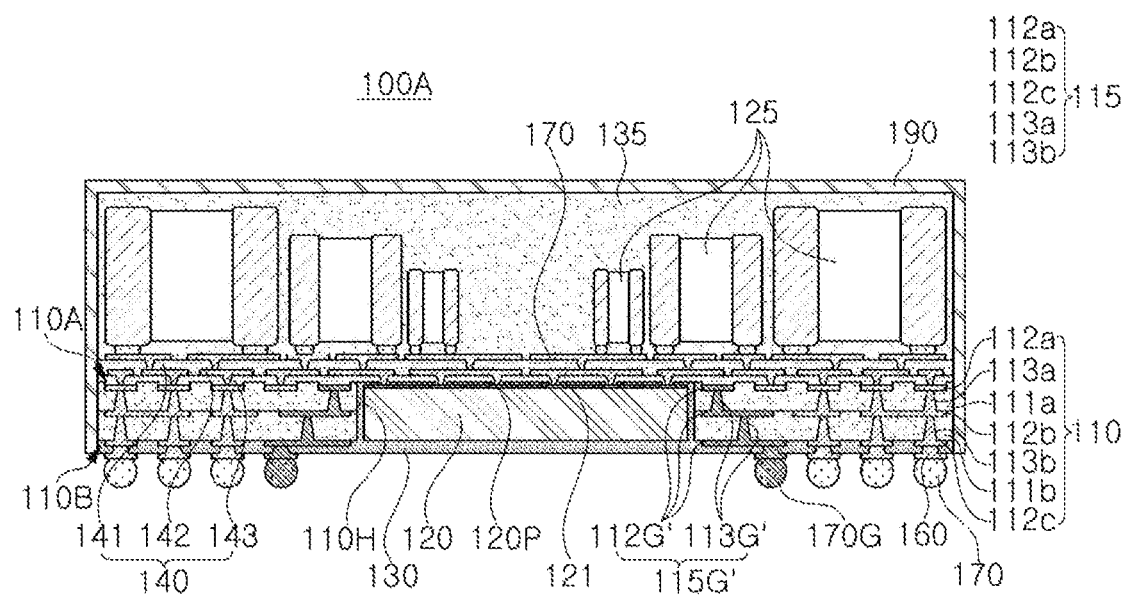
FIG. 14 and FIG. 15 are schematic cross-sectional views of a semiconductor package according to various exemplary embodiments of the present disclosure.

FIG. 14 is a schematic cross-sectional view of a semiconductor package according to an exemplary embodiment of the present disclosure.

Referring to FIG. 14, a semiconductor package 100A according to the present exemplary embodiment can be understood as being similar to the structures illustrated in FIG. 9 through FIG. 11, except for the shape of a shielding wiring structure 115G'. Components of the present exemplary embodiment, unless otherwise stated, can be better understood by referring to the descriptions of identical or similar components of the semiconductor package 100 described with reference to FIG. 9 through FIG. 11.

The semiconductor package 100A according to the present exemplary embodiment includes the shielding wiring structure 115G' arranged so as to surround the through-hole 110H of the frame 110. The shielding wiring structure 115G' includes a plurality of shielding vias 113G' and a plurality of shielding patterns 112G'. The plurality of shielding vias 113G' formed on the first and second insulating layers 111a and 111b may be stacked one on top of the other with the shielding patterns 112G' disposed therebetween. The plurality of shielding vias 113G' employed in the present exemplary embodiment, as illustrated in FIG. 14, may be arranged such that a center axis of one shielding via 113G' deviates from a center axis of another shielding via 113G' disposed on an adjacent level in the thickness direction of the semiconductor package 100A. For example, the plurality of shielding vias 113G' may be arranged such that there exists at least portions of the shielding vias 113G' disposed on the first insulating layer 111 that do not overlap the shielding vias 113G' disposed on the second insulating layer 111b in a plan view of the semiconductor package 100A.

FIG. 15 is a schematic cross-sectional view illustrating a semiconductor package according to an exemplary embodiment of the present disclosure.

Referring to FIG. 15, a semiconductor package 100B according to the present exemplary embodiment can be understood as being similar to the structures illustrated in FIG. 9 through FIG. 11, except for the wiring structure of a frame 110'. Components in the present exemplary embodiment, unless otherwise stated, can be better understood by referring to the descriptions of identical or similar components of the semiconductor package 100 described with reference to FIG. 9 through FIG. 11.

The frame 110' employed in the present exemplary embodiment may have a different structure and may have a wiring structure modified accordingly. More specifically, the frame 110' includes: a first insulating layer 111a; a first wiring pattern 112a disposed on one surface of the first insulating layer 111a; a second wiring pattern 112b disposed on the other surface of the first insulating layer 111a; a second insulating layer 111b disposed on one surface of the first insulating layer 111a and covering at least a portion of the first wiring pattern 112a; a third wiring pattern 112c disposed on the other surface of the second insulating layer 111b opposing one surface of the second insulating layer 111b in which the first wiring pattern 112a is buried; a third insulating layer 111c disposed on the other surface of the first insulating layer 111a and covering at least a portion of the second wiring pattern 112b; a fourth wiring pattern 112d disposed on the other surface of the third insulating layer 111c, opposing one surface of the third insulating layer 111c in which the second wiring pattern 112b is buried; a first wiring via 113a passing through the first insulating layer 111a to electrically connect the first and second wiring patterns 112a and 112b to each other; a second wiring via 113b passing through the second insulating layer 111b to electrically connect the first and third wiring patterns 112a and 112c to each other; and a third wiring via 113c passing through the third insulating layer 111c to electrically connect the second and fourth wiring patterns 112b and 112d to each other. The frame 110' employed in the present exemplary embodiment, due to including a relatively large number of wiring patterns 112a, 112b, 112c, and 112d, can further simplify the first redistribution layer 142 of the connection structure 140.

The first insulating layer 111a may have a greater thickness than a thickness of each of the second insulating layer 111b and the third insulating layer 111c. The first insulating layer 111a may be relatively thicker to maintain a basic rigidity, and the second insulating layer 111b and the third insulating layer 111c may be included to accommodate a greater number of wiring patterns 112c and 112d. The first insulating layer 111a may contain a different insulating material than the second insulating layer 111b and the third insulating layer 111c. For example, the first insulating layer 111a may contain, for example, a prepreg containing insulating resin, inorganic filler, and a core material such as glass fiber while the second insulating layer 111b and the third insulating layer 111c may be each PID or ABF containing inorganic filler and insulating resin. However, the first insulating layer 111a, the second insulating layer 111b, and the third insulating layer 111c are not limited thereto. Similarly, the first wiring via 113a passing through the first insulating layer 111a may have a larger diameter than a diameter of each of the second and third wiring vias 113b and 113c passing through the second and third insulating layers 111b and 111c, respectively. Also, the first wiring via 113a may have a cylindrical shape or a shape similar to an hourglass, and the second and third wiring vias 113b and 113c may have shapes tapering in opposite directions from each other. Each of the first to fourth wiring patterns 112a, 112b, 112c, and 112d may have a thickness greater than a thickness of the first redistribution layer 142 of the connection structure 140.

The wiring structure 115 according to the present exemplary embodiment includes a shielding wiring structure 115G passing through the first to third insulating layers 111a, 111b, and 111c and surrounding a through-hole 110H. The shielding wiring structure 115G includes a plurality of shielding vias 113G and a plurality of shielding patterns 112G. The plurality of wiring vias 113 are arranged to surround the through-hole 110H and include the plurality of shielding vias 113G formed in each of the first to third insulating layers 111a, 111b, and 111c. The plurality of wiring patterns 112 include the plurality of shielding patterns 112G connecting the shielding vias 113G on one level to shielding vias 113G on an adjacent level in a thickness direction of the semiconductor chip 120. Also, the plurality of electrical connection metal members 170 may include a plurality of grounding electrical connection metal members 170G connected to the plurality of shielding vias 113G or the shielding patterns 112G, and the plurality of grounding electrical connection metal members 170G may be also arranged to surround the through-hole 110H.

According to exemplary embodiments disclosed herein, the shielding wiring structure 115G and the grounding electrical connection metal bodies 170G, among other wiring structures, disposed to surround the semiconductor chip 120 (or the through-hole 110H) may be connected to each other, thereby providing a shielding structure capable of effectively blocking EMI generated by the semiconductor chip 120 disposed below the package.

Throughout the specification, a statement that an element is "connected to" or "coupled to" another element, it includes a case in which the element is indirectly connected or coupled to the other element through an adhesive layer or the like, as well as a case in which the element is directly connected or coupled to the other element. Also, when an element is "electrically connected" to another element, the element may or may not be in physical connection with the other element. Also, the terms "first," "second," and any variation thereof used herein, do not denote any order or importance of the elements, but are used for the purpose of distinguishing one element from another. For example, a first element could be termed as a second element, and similarly, a second element could be termed as a first element, without departing from the scope of the present disclosure.

The term "an exemplary embodiment" used herein does not refer to the same exemplary embodiment, and is provided to emphasize a particular feature of characteristic different from that of another exemplary embodiment. However, exemplary embodiments described herein can be implemented by being combined in whole or in part with one another. For example, For example, one element described in a particular exemplary embodiment, even if it is not described in another exemplary embodiment, may be understood as a description related to another exemplary embodiment unless an opposite or contradictory description is provided therein.

Terms used herein are used only to illustrate exemplary embodiments rather than limiting the scope of the present disclosure. Furthermore, the use of the singular includes the plural unless specifically stated otherwise.

What is claimed is:

1. A semiconductor package, comprising:
   a frame having a first surface and a second surface opposing each other, and including a through-hole and a wiring structure, the wiring structure connecting the first surface and the second surface to each other;
   a connection structure disposed on the first surface of the frame and including a redistribution layer;
   a semiconductor chip disposed in the through-hole and including connection pads connected to the redistribution layer;
   an encapsulant encapsulating the semiconductor chip and covering the second surface of the frame; and
   a plurality of electrical connection metal members disposed on the second surface of the frame and connected to the wiring structure,
   wherein the wiring structure includes a shielding wiring structure surrounding the through-hole, and the plurality of electrical connection metal members include a plurality of grounding electrical connection metal members connected to the shielding wiring structure, and
   wherein the shielding wiring structure includes a plurality of first shielding vias surrounding the through-hole and a plurality of second shielding vias surrounding the plurality of first shielding vias.

2. The semiconductor package of claim 1,
   wherein the frame includes a plurality of insulating layers,
   wherein the wiring structure includes a plurality of wiring patterns respectively disposed on the plurality of insulating layers, and includes a plurality of wiring vias respectively passing through the plurality of insulating layers and connecting the plurality of wiring patterns to each other, and
   wherein the plurality of first shielding vias and the plurality of second shielding vias each includes a plurality of shielding vias respectively passing through the plurality of insulating layers, and further includes a plurality of shielding patterns connecting the plurality of shielding vias to each other in a thickness direction of the semiconductor chip.

3. The semiconductor package of claim 2, wherein the plurality of shielding vias are arranged in two or more rows to surround the through-hole.

4. The semiconductor package of claim 2, wherein the plurality of grounding electrical connection metal members are arranged in two or more rows to surround the through-hole.

5. The semiconductor package of claim 2, wherein the plurality of shielding vias are arranged such that adjacent shielding vias disposed on different levels in the thickness direction overlap each other in a plan view of the semiconductor package.

6. The semiconductor package of claim 2, wherein the plurality of shielding vias are arranged such that center axes of adjacent shielding vias disposed on different levels in the thickness direction deviate from one another.

7. The semiconductor package of claim 2,
   wherein the plurality of insulating layers include a first insulating layer disposed on the first surface of the frame and a second insulating layer disposed on the second surface of the frame,
   wherein the plurality of wiring patterns include:
   a first wiring pattern buried in one surface of the first insulating layer and connected to the connection structure;
   a second wiring pattern disposed on another surface of the first insulating layer opposing the one surface of the first insulating layer in which the first wiring pattern is buried; and a third wiring pattern disposed on one surface of the second insulating layer opposing another surface of the second insulating layer on which the second wiring pattern is buried,
wherein the plurality of wiring vias include a first wiring via passing through the first insulating layer and connecting the first and second wiring patterns to each other, and a second wiring via passing through the second insulating layer and connecting the second and third wiring patterns to each other.

8. The semiconductor package of claim 2,
wherein the plurality of insulating layers include a first insulating layer, and second and third insulating layers disposed opposing surfaces of the first insulating layer,
wherein the wiring structure includes first and second wiring patterns disposed on the opposing surfaces of the first insulating layer, a third wiring pattern disposed on the second insulating layer, and a fourth wiring pattern disposed on the third insulating layer, and
wherein the plurality of wiring vias include a first wiring via passing through the first insulating layer and connecting the first and second wiring patterns to each other, a second wiring via passing through the second insulating layer and connecting the first and third wiring patterns to each other, and a third wiring via passing through the third insulating layer and connecting the second and fourth wiring patterns to each other.

9. The semiconductor package of claim 1, wherein the plurality of electrical connection metal members further include an additional grounding electrical connection metal member disposed adjacent to a corner of the second surface of the frame.

10. The semiconductor package of claim 1, further comprising at least one passive component disposed on the connection structure and connected to the redistribution layer.

11. The semiconductor package of claim 10, further comprising an additional encapsulant and a metal layer disposed on a surface of the additional encapsulant, the additional encapsulant being disposed on the connection structure and encapsulating the at least one passive component.

12. The semiconductor package of claim 1, wherein at least one of the plurality of grounding electrical connection metal members is connected to the plurality of second shielding vias.

13. A semiconductor package, comprising:
a frame having a first surface and a second surface opposing each other, and including a through-hole, a plurality of insulating layers, and a wiring structure, the wiring structure connecting the first surface and the second surface to each other;
a connection structure disposed on the first surface of the frame and including a redistribution layer;
a semiconductor chip disposed in the through-hole and including connection pads connected to the redistribution layer;
an encapsulant encapsulating the semiconductor chip and covering the second surface of the frame; and
a plurality of electrical connection metal members disposed on the second surface of the frame and connected to the wiring structure,
wherein the wiring structure includes a plurality of wiring patterns respectively disposed on the plurality of insulating layers, and includes a plurality of wiring vias respectively passing through the plurality of insulating layers and connecting the plurality of wiring patterns to each other,
wherein the plurality of wiring vias include a plurality of shielding vias arranged to surround the through-hole and respectively disposed on the plurality of insulating layers,
wherein the plurality of wiring patterns include a plurality of shielding patterns connecting the plurality of shielding vias to each other in a thickness direction of the semiconductor chip,
wherein the plurality of electrical connection metal members include a plurality of grounding electrical connection metal members connected to the plurality of shielding vias or to the plurality of shielding patterns,
wherein the plurality of wiring vias include another plurality of shielding vias arranged to surround the plurality of shielding vias, and
wherein the plurality of electrical connection metal members include another plurality of grounding electrical connection metal members connected to the another plurality of shielding vias.

14. The semiconductor package of claim 13, wherein the plurality of shielding vias are arranged in two or more rows to surround the through-hole, and the plurality of shielding vias are arranged in a zig-zag manner in a plan view of the semiconductor package.

15. The semiconductor package of claim 13, wherein the plurality of shielding patterns are arranged such that adjacent shielding patterns disposed on a same level in the thickness direction are contiguous to each other.

16. The semiconductor package of claim 13, wherein the plurality of shielding vias are arranged such that center axes of adjacent shielding vias disposed on different levels in the thickness direction deviate from one another.

17. The semiconductor package of claim 13, further comprising an underbump metal (UBM) layer disposed on the second surface of the frame to connect the plurality of electrical connection metal members and the wiring structure to each other.

* * * * *